United States Patent
Zhao (10) Patent No.: US 10,615,351 B2
(45) Date of Patent: Apr. 7, 2020

(54) FLEXIBLE DISPLAY ASSEMBLY INCLUDING A FIRST INORGANIC LAYER FORMED IN BENDING REGION HAVING A THICKNESS LESS THAN A SECOND INORGANIC LAYER FORMED IN NON-BENDING REGION, A MANUFACTURING METHOD FOR FORMING THE SAME, AND A DISPLAY PANEL

(71) Applicant: Wuhan China Star Optoelectronics Semiconductor Display Technology Co., Ltd., Wuhan, Hubei (CN)

(72) Inventor: Chen Zhao, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 26 days.

(21) Appl. No.: 15/738,010

(22) PCT Filed: Nov. 23, 2017

(86) PCT No.: PCT/CN2017/112599
§ 371 (c)(1),
(2) Date: Dec. 19, 2017

(87) PCT Pub. No.: WO2019/090840
PCT Pub. Date: May 16, 2019

(65) Prior Publication Data
US 2019/0140197 A1    May 9, 2019

(30) Foreign Application Priority Data
Nov. 9, 2017    (CN) .......................... 2017 1 1125755

(51) Int. Cl.
H01L 51/52    (2006.01)
H01L 51/56    (2006.01)
H01L 51/00    (2006.01)

(52) U.S. Cl.
CPC ...... *H01L 51/0097* (2013.01); *H01L 51/5237* (2013.01); *H01L 51/5256* (2013.01); *H01L 51/56* (2013.01); *H01L 2251/5338* (2013.01)

(58) Field of Classification Search
CPC .. H01L 51/0097; H01L 51/5237; H01L 51/56
See application file for complete search history.

(56) References Cited

U.S. PATENT DOCUMENTS 7,348,492 B1 * 3/2008 Kawai ................. G02F 1/13452
                                                                174/254
2010/0144085 A1    6/2010 Chan et al.
(Continued)

FOREIGN PATENT DOCUMENTS

| CN | 106847870 A | 6/2017 |
|----|-------------|--------|
| CN | 106848108 A | 6/2017 |
| CN | 107331795 A | 11/2017 |

*Primary Examiner* — Anh D Mai
(74) *Attorney, Agent, or Firm* — Andrew C. Cheng (57) ABSTRACT

A flexible display assembly, a manufacturing method thereof, and a display panel are provided. The flexible display assembly comprises a display layer, a first thin film layer, and a second thin film layer. The display layer comprises a non-bending region and a bending region. The first thin film layer comprises at least a first inorganic layer and organic layer formed sequentially in the bending region. The second thin film layer comprises and a second inorganic layer and organic layer formed sequentially in the non-bending region. A modulus difference between the first inorganic layer and the display layer is less than that between the second inorganic layer and the display layer, and/or a thickness of the first inorganic layer is less than that (Continued)

of the second inorganic layer; a thickness of the first thin film layer is equal to that of the second thin film layer.

13 Claims, 5 Drawing Sheets

(56) References Cited

U.S. PATENT DOCUMENTS

| | | |
|---|---|---|
| 2015/0147532 A1 | 5/2015 | Nam et al. |
| 2016/0226024 A1* | 8/2016 | Park .................... H01L 51/5256 |
| 2017/0294495 A1 | 10/2017 | Shyu et al. |
| 2017/0309652 A1 | 10/2017 | Qian |

* cited by examiner

FLEXIBLE DISPLAY ASSEMBLY INCLUDING A FIRST INORGANIC LAYER FORMED IN BENDING REGION HAVING A THICKNESS LESS THAN A SECOND INORGANIC LAYER FORMED IN NON-BENDING REGION, A MANUFACTURING METHOD FOR FORMING THE SAME, AND A DISPLAY PANEL

FIELD OF THE DISCLOSURE

The present disclosure relates to a display technology, and more particularly to a flexible display assembly, a manufacturing method thereof, and a display panel.

BACKGROUND

With the development of display technology, the demand for color and lightness is getting higher and higher. Active matrix organic light-emitting diode (AMOLED) is gradually applying to consumer electronic markets such as mobile devices and televisions. OLED display device has advantages of high brightness, wide viewing angle, fast response, ultra-thin, light weight, can be made on a flexible substrate and so on. Compared with the traditional TFT-LCD technology, the biggest advantage of OLED is that it can be made into flexible products. To achieve the bendable and crimpable nature of OLED, industry researchers have done a great deal of work on flexible substrates and flexible encapsulation. For flexible encapsulation, the main technology is thin film encapsulation (Thin Film Encapsulation, TFE). And currently, the most commonly used encapsulation is to form an encapsulating barrier by using multilayer organic-inorganic thin film combination. Inorganic thin films can be prepared very uniform and dense, with excellent water and oxygen barrier properties, while organic thin film can absorb and distribute the stress between layer and layer, to avoid crack or even stratification that cannot block the water and oxygen due to the inherent brittleness and defects of the inorganic thin film.

During the bending process of the flexible screen, since there is a great modulus difference between the TFE and the material of the OLED layer, the interface stress between the TFE and the OLED will be abruptly changed during the bending process. Under the effect of larger stress, bending or peeling phenomenon appear in the bending area easily, making the entire screen shows problems or even failure.

SUMMARY

The present disclosure is aim to provide a flexible display assembly, a manufacturing method thereof and a display device, which are able to solve the crack problems during bending process.

In order to overcome the shortcomings of the prior arts, the present disclosure provides a flexible display assembly comprising a display layer, a first thin film layer and a second thin film layer. The display layer comprises a non-bending region and a bending region. The first thin film comprises an inorganic layer and a first organic layer formed in the bending region in sequence. The second thin film layer comprises a second inorganic layer and a second organic layer formed in the non-bending region in sequence. A modulus difference between the first inorganic layer and the display layer is less than that between the second inorganic layer and the display layer, and/or a thickness of the first inorganic layer is less than that of the second inorganic layer; and a thickness of the first thin film layer is equal to that of the second thin film layer.

The present disclosure further comprises a method of manufacturing a flexible display assembly, comprising:

Dividing a display layer into an non-bending region and a bending region;

Forming at least a first inorganic layer and a first organic layer in the bending region in sequence, and forming at least a second inorganic layer and a second organic layer in the non-bending region in sequence;

Wherein a modulus difference of the first inorganic layer is less than that of the second inorganic layer, and/or a thickness of the first inorganic layer is less than that of the second inorganic layer; and a thickness of the first inorganic layer and the first organic layer formed in the bending region in sequence is equal to that of the second inorganic layer and the second organic layer formed in the non-bending region in sequence.

The present disclosure further comprises yet another display panel, comprising the flexible display assembly as provided in following embodiments.

Compared with the prior art, the benefit of the present disclosure is: by dividing the display layer into a bending region and an non-bending region, parameters such as the material and/or the thickness of the inorganic layer and the organic layer are adjusted on different regions. Wherein the modulus difference between the first inorganic layer and the display layer is smaller than that between the second inorganic layer and the display layer. That is, the modulus difference between the first inorganic layer and the display layer in the bending region is reduced, and/or the thickness d of the first inorganic layer is smaller than the thickness D of the second inorganic layer. Making the first inorganic layer is more conducive to bending, so as to reduce the interface stress between the first inorganic layer and the display layer, improve the cracking phenomenon during bending of the display layer, and improve the bending reliability of the display layer.

DETAILED DESCRIPTION OF PREFERRED EMBODIMENTS

The technical solutions of the present disclosure are clearly and completely described below with reference to the accompanying drawings in the embodiments of the present disclosure. Apparently, the described embodiments are only illustrating, other embodiments obtained by persons of ordinary skill in the art based on the embodiments of the present disclosure without creative efforts shall fall within the protection scope of the present disclosure.

Figure 1:
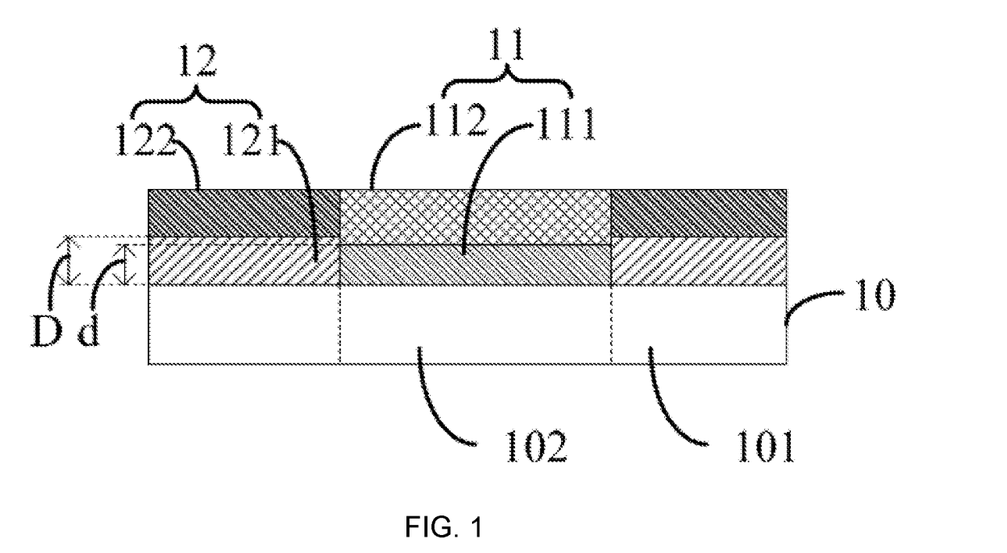
FIG. 1 is a structural schematic diagram of a flexible display assembly of the present disclosure.

Please refer to FIG. 1, the present disclosure provides a flexible display assembly, comprising a display layer 10, a first thin film layer 11 and a second thin film layer 12. Herein the display layer 10 comprises a non-bending region 101 and a bending region 102. The first thin film layer 11 comprises at least a first inorganic layer 111 and a first organic layer 112 formed in the bending region 102 in sequence. The second thin film layer 12 comprises at least a second inorganic layer 121 and a second organic layer 122 formed in the non-bending region 101 in sequence.

Herein, a modulus difference between the first inorganic layer 111 and the display layer 10 is less than that between the second inorganic layer 121 and the display layer 10, and/or a thickness d of the first inorganic layer 111 is less than a thickness D of the second inorganic layer 121. A thickness of the first thin film layer 11 is equal to that of the second thin film layer 12, that is the thickness of all the inorganic layer and organic layer in the first thin film layer 11 is equal to the thickness of all the inorganic layer and organic layer in the second thin film layer 12.

Generally, the display layer 10 is used to provide display function, For example, the display layer 10 in the OLED display panel includes an organic luminescent material coating layer, a substrate, an anode, a cathode, an electron transport layer, a hole injection layer, etc. Since the display layer 10 is an important part of the flexible OLED display panel, while blocking the water and oxygen, bending performance of the flexible display panel is also expecting to be improved. In this embodiment, the display layer 10 is divided into a bending region 102 and a non-bending region 101. The bending region 102 is a region that can be bent, and the non-bending region 101 is a region that generally cannot be bent. The parameters such as the material and/or the thickness of the inorganic and organic layers are adjusted at different regions to improve the bending reliability of the bending region 102, wherein the modulus difference between the first inorganic layer 111 and the display layer 10 refers to an absolute value of the difference between the two, similarly the modulus difference between the second inorganic layer 121 and the display layer 10 is also an absolute value of the difference between the two. The modulus difference between the first inorganic layer 111 and the display layer 10 is less than that between the second inorganic layer 121 and the display layer 10. That is, the modulus difference between the first inorganic layer 111 and the display layer 10 in the bending region 102 is decreased, so as to reduce the interface stress between the first inorganic layer 111 and the display layer, improve the cracking phenomenon generated during the bending of the display layer 10 and improve the bending reliability of the display layer 10. And/or the thickness d of the first inorganic layer 111 is smaller than the thickness D of the second inorganic layer 121, the first inorganic layer 111 can be more easily bent by reducing the thickness of the first inorganic layer 111, so that the stress of the first inorganic layer 111 generated in the bending process is reduced to improve the cracking phenomenon generated in the bending process of the display layer 10 and improve the bending reliability of the display layer 10.

A material of the first organic layer 111 may comprises at least one of silicon oxide, aluminum oxide and silicon nitride. Preferably, the material of the first organic layer 111 is silicon oxide. Among the silicon oxide, the aluminum oxide and the silicon nitride, the modulus of silicon oxide is the lowest, which is about 70 GPa, the modulus of silicon nitride is about 220 GPa, and the modulus of alumina is about 300 GPa. In the present embodiment, the modulus generally refers to the modulus of elasticity and is a physical quantity for measuring the stiffness of a material. The greater the modulus of the material, the greater the stiffness of the material, which is less prone to buckling. On the contrary, the smaller the modulus of the material, the greater the toughness of the material, which is easy to bend. When the first inorganic layer 111 is made of a mixed material, the content of the first inorganic layer 111 accounts for 50%~98%, for example, among a mixture of silicon oxide, aluminum oxide and silicon nitride, the content of the silicon oxide accounts for 50%~95% of total material of the first inorganic layer 111, optionally is 60~90%, and certainly can also be less than 50%.

Preferably, a material of the second organic layer 121 may comprises at least one of silicon oxide, aluminum oxide and silicon nitride. However, it is necessary to ensure that the modulus difference between the first inorganic layer 111 and the display layer 10 is smaller than that between the second inorganic layer 121 and the display layer 10. For example, when the modulus of the inorganic material is larger than that of the display layer 10, the modulus of the first inorganic layer 111 has to be ensured smaller than the modulus of the second inorganic layer 121.

A thickness of the first inorganic layer 111 is less than 500 nm. Preferably, the thickness of the first inorganic layer 111 is 450 nm or less than 300 nm. In the present embodiment, the thickness of the first inorganic layer generally needs to be balanced between the barrier properties of water and oxygen and the bending performance A thickness of the second inorganic layer 121 is 500 nm~2 µm. Preferably, the thickness of the second inorganic layer 121 is 550 nm~1.5 µm, and preferably, is 700 nm~1.5 µm. The thickness of the second inorganic layer 121 may also be less than 500 nm, and the thickness of the first inorganic layer 111 is less than that of the second inorganic layer 121.

Figure 2:
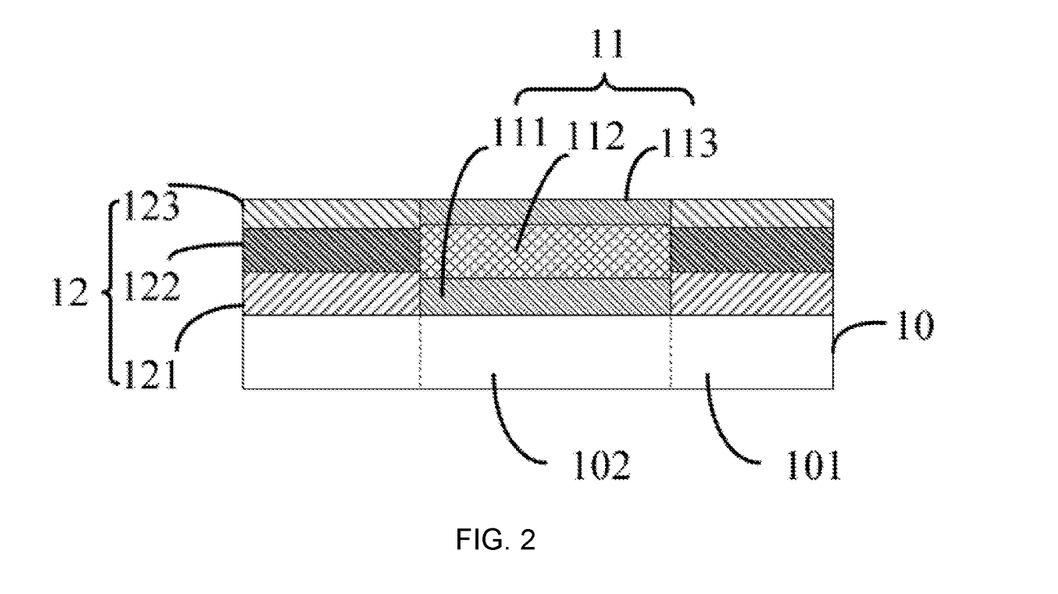
FIG. 2 is another structural schematic diagram of a flexible display assembly of the present disclosure.

Please refer to FIG. 2, the first thin film layer 11 further comprises a third inorganic layer 113 formed on the first organic layer 112. The second thin film layer 12 further comprises a fourth inorganic layer 123 formed on the second organic layer 122. Wherein, the modulus difference of the third inorganic layer 113 is less than or equal to that of the fourth inorganic layer 123, and/or a thickness of the third inorganic layer 113 is less than or equal to that of the fourth inorganic layer 123. Preferably, the modulus difference of the third inorganic layer 113 is less than that of the fourth inorganic layer 123, and/or the thickness of the third inorganic layer 113 is less than that of the fourth inorganic layer 123 to further ensure the bending function of the first thin film layer 11. It should be understood that the modulus difference of the third inorganic layer 113 is greater than that of the fourth inorganic layer 123, and/or the thickness of the third inorganic layer 113 is greater than that of the fourth inorganic layer 123. However, it should be ensured that the first film layer 11 is more flexible than the second film layer 12.

In the present embodiment, a plurality of inorganic layers and organic layers can be formed in the first thin film layer 11, for example, three inorganic layers and two organic layers are sequentially formed in the bending region 102 as the first inorganic layer 111, the first organic layer 112, the third inorganic layer 113, a third organic layer (not shown) and a fifth inorganic layer (not shown). Herein, the thickness and/or material of the first inorganic layer 111, the third inorganic layer 113 and the fifth inorganic layer can be the same or different from each other. The thickness and/or material of the first organic layer 112 and the third organic layer 113 can be the same or different from each other. Also, a plurality of inorganic layers and organic layers can be formed in the second thin film layer 12, for example, three inorganic layers and two organic layers are sequentially formed the bending region 102 as the second inorganic layer 121, the second organic layer 122, the fourth inorganic layer 123, a fourth organic layer (not shown) and a sixth inorganic layer (not shown). Herein, the thickness and/or material of the second inorganic layer 121, the fourth inorganic layer 123 and the sixth inorganic layer can be the same or different from each other. The thickness and/or material of the second organic layer 122 and the fourth organic layer 113 can be the same or different from each other.

Figure 3:
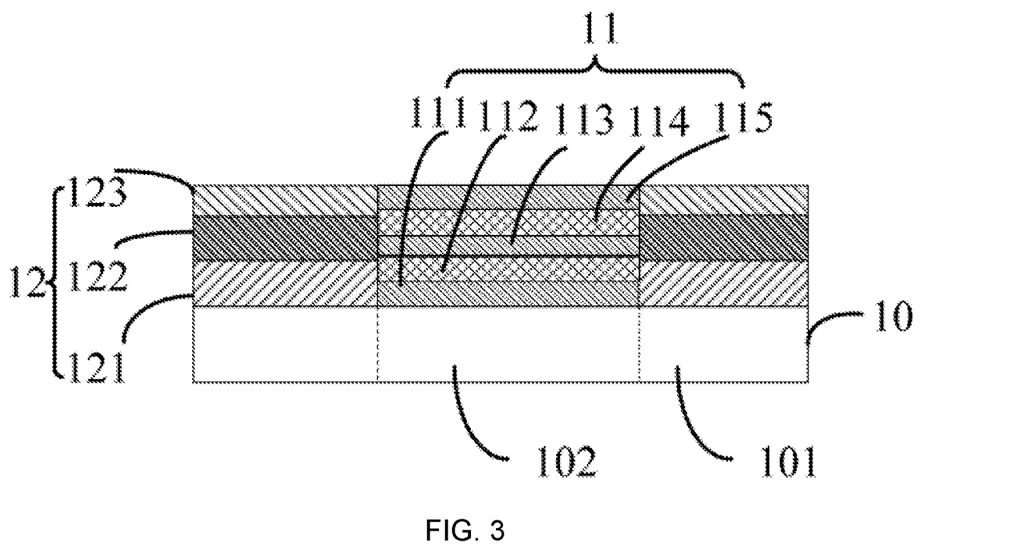
FIG. 3 is yet another structural schematic diagram of a flexible display assembly of the present disclosure.

Please refer to FIG. 3, a number of the inorganic layer and the organic layer in the first thin film layer 11 is greater than or equal to that of the inorganic layer and the organic layer in the second thin film layer 12. Preferably, the number of the inorganic layer and organic layer in the first thin film layer 11 is greater than the number of the inorganic layer and organic layer in the second thin film layer 12. For example, the first thin film layer 11 comprises three inorganic layers and two organic layers are sequentially formed in the bending region 102 as the first inorganic layer 111, the first organic layer 112, the third inorganic layer 113, the third organic layer and the fifth inorganic layer, which has a thickness of 400 nm, 2 µm, 450 nm, 2 µm and 600 nm, respectively. The second thin film layer 12 comprises two inorganic layers and one organic layer being sequentially formed as the second inorganic layer 121, the second organic layer 122, the fourth inorganic layer 123 in the non-bending region 101. The thickness of which are 1.2 µm, 3 µm and 1.25 µm, respectively. The thickness of the first thin film layer is equal to the thickness of the second thin film layer 12. The number of the inorganic layer and the organic layer in the first thin film layer 11 is greater than the number of the inorganic layer and organic layer in the second thin film layer 12. Such that, not only can the bending performance of the first film layer 11 on the bending region 102 be ensured, but also the display layer 10 can have a good encapsulation effect.

Preferably, the first organic layer 122 comprises at least one of polymethylmethacrylate (PMMA) and hexamethyldisiloxane (HMDSO).

Preferably, the second organic layer 122 comprises at least one of polymethylmethacrylate and hexamethyldisiloxane.

Preferably, the thickness of the first organic layer 112 is 1 µm~10 µm.

Preferably, the thickness of the second organic layer 122 is 1 µm~10 µm.

In the present disclosure, a junction between adjacent organic layers or adjacent inorganic layers in the bending region 102 and non-bending region 101 can be made into an integral structure in actual production. Also, it can be arranged in interleaving layers, such as the second organic layer 122 may extend above the junction of the first inorganic layer 111 and the second inorganic layer 121 to provide a better encapsulation effect. In short, the junctions are closely connected to form an effective encapsulation effect, as FIGS. 1-3 are schematic views only.

Figure 4:
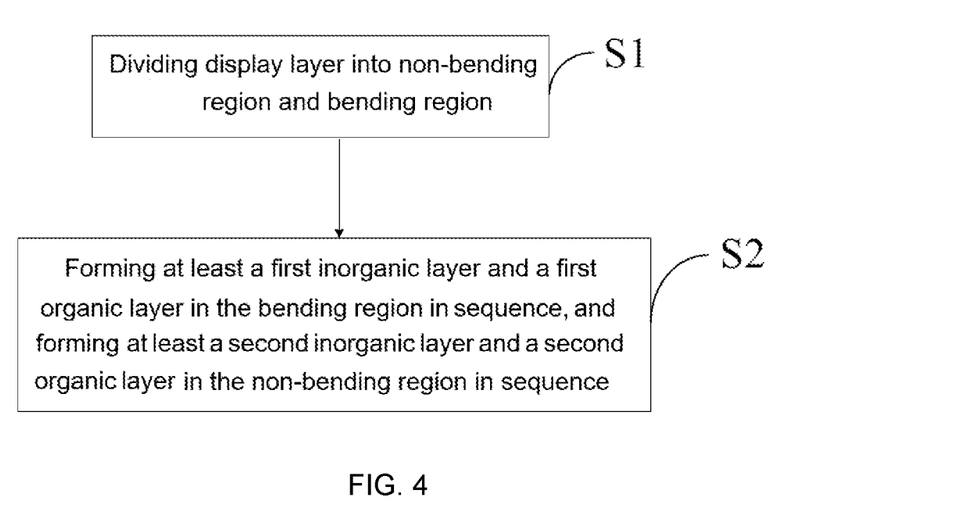
FIG. 4 is a flow chart of a method for manufacturing a flexible display assembly in one embodiment of the present disclosure.

Please refer to FIG. 4, a method of manufacturing a flexible display assembly of the present disclosure comprises the following steps:

S1, dividing a display layer 10 into a non-bending region 101 and a bending region 102. Specifically, dividing a bendable area into a bending region 102 during the manufacturing process, for example, the display panel area is bendable, the corresponding display layer thereof is regarded as bendable region 102, and the other parts are non-bendable region 101.

S2, forming at least a first inorganic layer 111 and a first organic layer 112 in the bending region 102 in sequence, and forming at least a second inorganic layer 121 and a second organic layer 122 in the non-bending region 101 in sequence.

Figure 5:
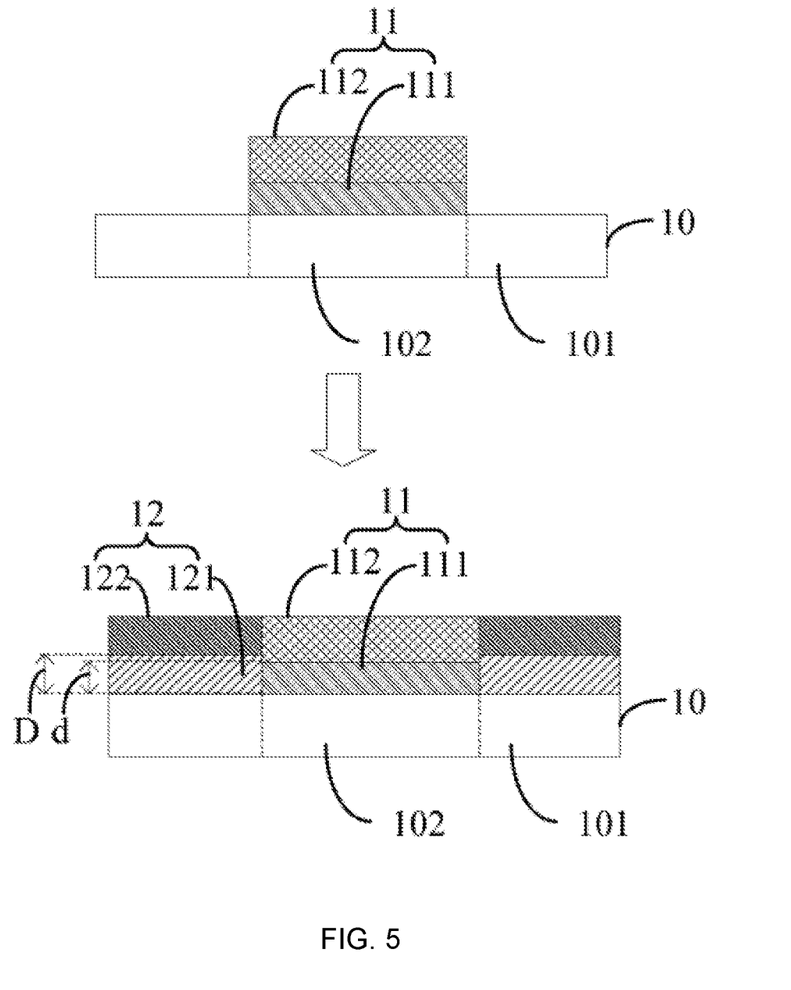
FIG. 5 is a schematic diagram of a method for manufacturing a flexible display assembly in one embodiment of the present disclosure.

For example, please refer to FIG. 5, forming at least a first inorganic layer 111 and a first organic layer 112 in the bending region 102 in sequence, and then forming at least a second inorganic layer 121 and a second organic layer 122 in the non-bending region 101 in sequence. That is, first forming inorganic layer and organic layer in the bending region 102, and then forming inorganic layer and organic layer in the non-bending region 101. Or forming inorganic layer and organic layer in the non-bending region 101, and then forming inorganic layer and organic layer in the bending region 102.

Figure 6:
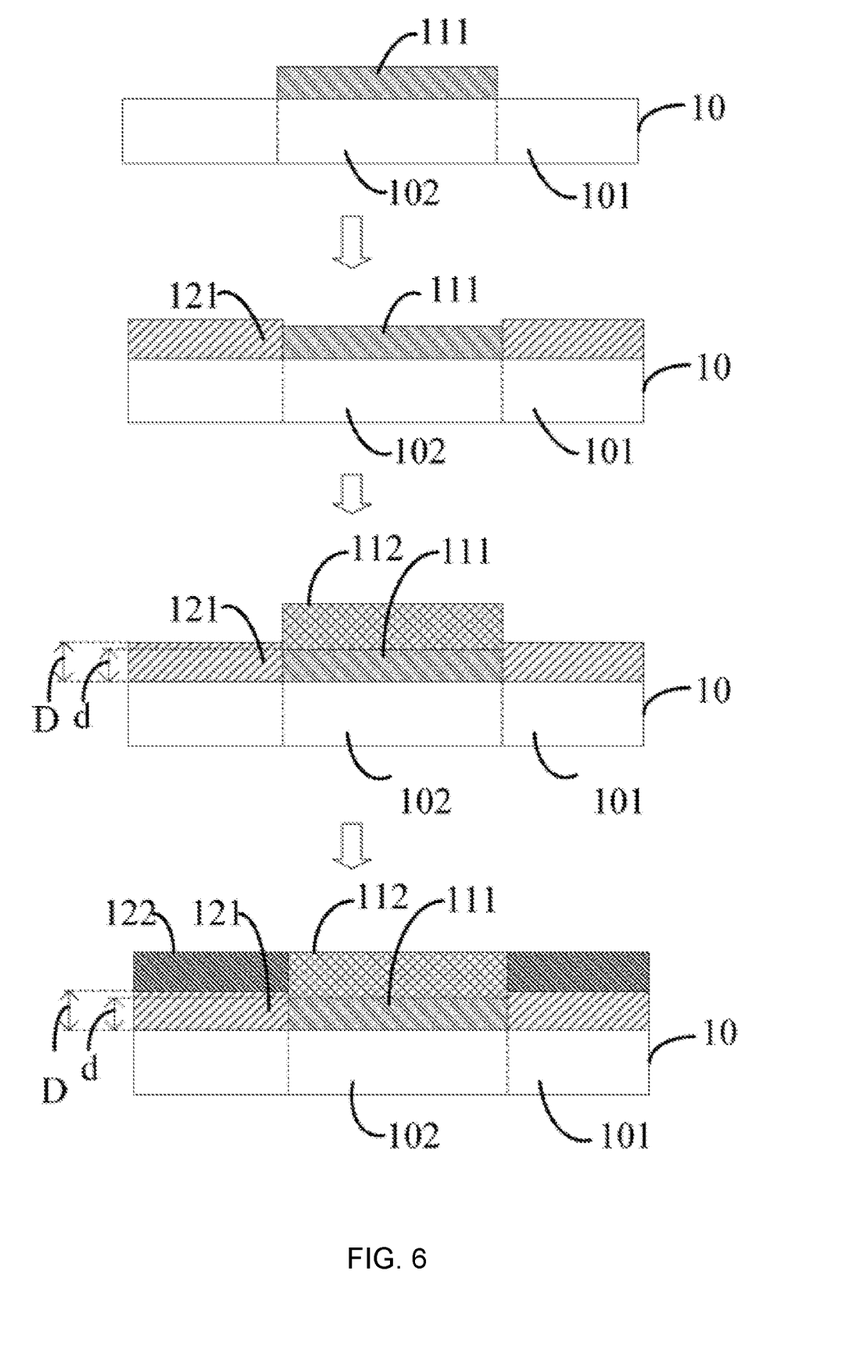
FIG. 6 is a schematic diagram of a method for manufacturing a flexible display assembly in another embodiment of the present disclosure.

Or, please refer to FIG. 6, forming the first inorganic layer 111 in the bending region 102, and then forming a second inorganic layer 121 in the non-bending region 101; further forming at least one of the first organic layer 112 on the first inorganic layer 111 in the bending region 102, and forming at least one of the second organic layer 122 on the second inorganic layer 121 in the non-bending region 101. That is, the inorganic layer and the organic layer are alternately formed on the bending region 102 and the non-bent region 101. Of course in other embodiment, it is capable to form the second inorganic layer 121 in the non-bending region 101 in advance, and then to form the first inorganic layer 111 in the bending region 102, further to form the second organic layer 122 on the second inorganic layer 121 in the non-bending region 101, and to form the first organic layer 112 on the first inorganic layer 111 in the bending region 102.

In the present embodiment, the inorganic layer and organic layer forming orders in the bending region 102 and the non-bending region 101 are not limited. For example, it is capable to form the inorganic layer and organic layer in the non-bending region 101 in advance, and then to form the inorganic layer and organic layer in the bending region 102.

Herein, a modulus difference between the first inorganic layer 111 and the display layer 10 is less than that between the second inorganic layer 121 and the display layer 10, and/or a thickness d of the first inorganic layer 111 is less than a thickness D of the second inorganic layer 121. The thickness of the first inorganic layer 111 and the first organic layer 112 that are sequentially formed in the bending region 102 is equal to the thickness of the second inorganic layer 121 and the second organic layer 122 that are sequentially formed in the non-bending region 101.

Figure 7:
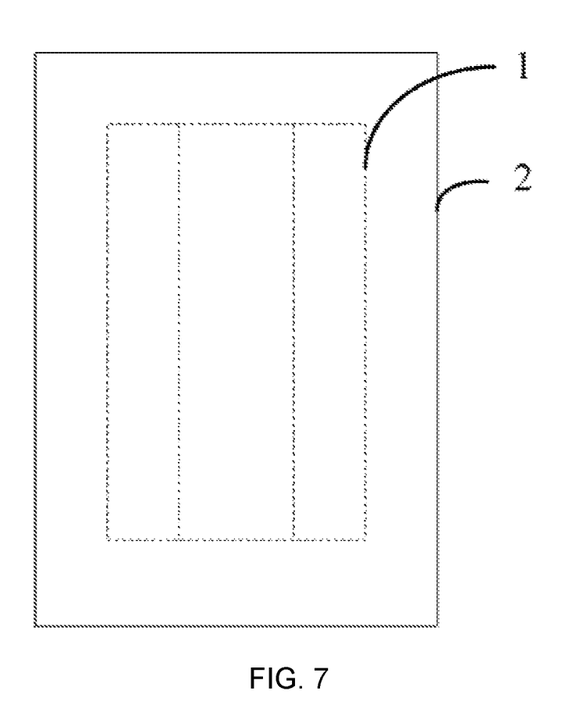
FIG. 7 is a structural schematic diagram of display panel in one embodiment of the present disclosure.

Please refer to FIG. 7, a display panel 2 in the embodiment of the present disclosure comprises the flexible display assembly 1 of the foregoing embodiments.

In summary, by dividing the display layer 10 into a bending region 102 and an non-bending region 101, parameters such as the material and/or the thickness of the inorganic layer and the organic layer are adjusted on different regions. Wherein the modulus difference between the first inorganic layer 111 and the display layer 10 is smaller than that between the second inorganic layer 121 and the display layer 10. That is, the modulus difference between the first inorganic layer 111 and the display layer 10 in the bending region 102 is reduced, and/or the thickness d of the first inorganic layer 111 is smaller than the thickness D of the second inorganic layer 121. Making the first inorganic layer 111 is more conducive to bending, so as to reduce the interface stress between the first inorganic layer 111 and the display layer 10, improve the cracking phenomenon during bending of the display layer 10, and improve the bending reliability of the display layer 10.

While the disclosure has been particularly shown and described with reference to exemplary embodiments thereof, it will be understood by those skilled in the art that various changes in form and details may be made therein without departing from the spirit and scope of the disclosure as defined by the appended claims and their equivalents.

What is claimed is:

1. A flexible display assembly comprising:
    a display layer comprising a non-bending region and a bending region;
    a first thin film layer comprising at least a first inorganic layer and a first organic layer formed in the bending region in sequence;
    a second thin film layer comprising at least a second inorganic layer and a second organic layer formed in the non-bending region in sequence;
    wherein a modulus difference between the first inorganic layer and the display layer is less than that between the second inorganic layer and the display layer, and/or a thickness of the first inorganic layer is less than that of the second inorganic layer; and a thickness of the first thin film layer is equal to that of the second thin film layer;
    wherein a number of the inorganic layer and the organic layer in the first thin film layer is greater than that of the inorganic layer and the organic layer in the second thin film layer.

2. The flexible display assembly according to claim 1, wherein the first thin film layer further comprises a third inorganic layer formed on the first organic layer; the second thin film layer further comprises a fourth inorganic layer formed on the second organic layer; wherein the modulus difference of the third inorganic layer is less than or equal to that of the fourth inorganic layer, and/or a thickness of the third inorganic layer is less than or equal to that of the fourth inorganic layer.

3. The flexible display assembly according to claim 2, wherein a material of the first inorganic layer comprises at least one of silicon oxide, aluminum oxide and silicon nitride; and/or a material of the second inorganic layer comprises at least one of silicon oxide, aluminum oxide and silicon nitride.

4. The flexible display assembly according to claim 3, wherein among the material of the first inorganic layer, a content of silicon oxide accounts for 50%~100% of the total amount of the material of the first inorganic layer.

5. The flexible display assembly according to claim 1, wherein a thickness of the first inorganic layer is less than 500 nm; and/or a thickness of the second inorganic layer is 500 nm~2 µm.

6. The flexible display assembly according to claim 1, wherein the first organic layer comprises at least one of polymethylmethacrylate and hexamethyldisiloxane; and/or the second organic layer comprises at least one of polymethylmethacrylate and hexamethyldisiloxane.

7. A display panel comprising the flexible display assembly of claim 1.

8. A method for manufacturing a flexible display assembly, comprising:
    dividing a display layer into an non-bending region and a bending region;
    forming at least a first inorganic layer and a first organic layer in the bending region in sequence, and forming at least a second inorganic layer and a second organic layer in the non-bending region in sequence;
    wherein a modulus difference of the first inorganic layer is less than that of the second inorganic layer, and/or a thickness of the first inorganic layer is less than that of the second inorganic layer; and a thickness of the first inorganic layer and the first organic layer formed in the bending region in sequence is equal to that of the second inorganic layer and the second organic layer formed in the non-bending region in sequence;
    wherein a number of the inorganic layer and the organic layer in the first thin film layer is greater than that of the inorganic layer and the organic layer in the second thin film layer.

9. The method for manufacturing a flexible display assembly according to claim 8, further comprising forming a third inorganic layer on the first organic layer in the bending region, and forming a fourth inorganic layer on the second organic layer in the non-bending region; where a modulus difference of the third inorganic layer is less than or equal to that of the fourth inorganic layer, and/or a thickness of the third inorganic layer is less than that of the fourth inorganic layer.

10. The method for manufacturing a flexible display assembly according to claim 9, wherein a material of the first inorganic layer comprises at least one of silicon oxide, aluminum oxide, and silicon nitride; and/or a material of the second inorganic layer comprises at least one of silicon oxide, aluminum oxide and silicon nitride.

11. The method for manufacturing a flexible display assembly according to claim 10, wherein among the material of the first inorganic layer, a content of silicon oxide accounts for 50%~100% of the total amount of the material of the first inorganic layer.

12. The method for manufacturing a flexible display assembly according to claim 8, wherein a thickness of the first inorganic layer is less than 500 nm; and/or a thickness of the second inorganic layer is 500 nm~2 µm.

13. The method for manufacturing a flexible display assembly according to claim 8, wherein the first organic layer comprises at least one of polymethylmethacrylate and hexamethyldisiloxane; and/or the second organic layer comprises at least one of polymethylmethacrylate and hexamethyldisiloxane.

* * * * *